US012542427B1

(12) United States Patent
Staff et al.

(10) Patent No.: US 12,542,427 B1
(45) Date of Patent: Feb. 3, 2026

(54) GUIDE TO INSTALLATION, OPERATION AND LATCHING OF POWER CABLES

(71) Applicant: AMD Design, LLC, Wilmington, DE (US)

(72) Inventors: Nathan William Staff, Secaucus, NJ (US); Michael Dennis Marcade, Secaucus, NJ (US); Kerry Hong, Secaucus, NJ (US); Ellie Elsu, Secaucus, NJ (US)

(73) Assignee: AMD Design, LLC, Wilmington, DE (US)

( * ) Notice: Subject to any disclaimer, the term of this patent is extended or adjusted under 35 U.S.C. 154(b) by 257 days.

(21) Appl. No.: 18/503,380

(22) Filed: Nov. 7, 2023

(51) Int. Cl.
*H05K 7/14* (2006.01)
*H02B 1/04* (2006.01)
*H02B 1/052* (2006.01)

(52) U.S. Cl.
CPC .......... *H02B 1/041* (2013.01); *H02B 1/0523* (2013.01); *H05K 7/1417* (2013.01); *H05K 7/1491* (2013.01); *H05K 7/1457* (2013.01)

(58) Field of Classification Search
CPC ..... H02B 1/041; H02B 1/0523; H01R 13/629
See application file for complete search history.

(56) References Cited

U.S. PATENT DOCUMENTS

2006/0185159 A1\* 8/2006 Correll ................... H01R 43/22
29/832
2016/0308322 A1\* 10/2016 Bierbaum .............. H01R 24/64

\* cited by examiner

Primary Examiner — Mukundbhai G Patel
(74) Attorney, Agent, or Firm — Dergosits & Noah LLP; Todd A. Noah

(57) ABSTRACT

A method and guide are provided that facilitate the installation and removal of cabling in hard-to-reach locations using a holder to maintain the relative locations of a cable and cable-side connectors and a handle that slides with respect to the holder. The handle may be used to move the cable and cable-side connectors into position with respect to board-side PDB connectors within a chassis. With further downward movement or insertion of the handle, the connectors are then mated. With the handle in a fully downward, inserted, or otherwise latched position with respect to the holder, raised sections of the handle prevent latching teeth or hooks on the cable-side connector from becoming disengaged from the PDB board-side connector, thereby maintaining the connection of the PDB connectors. Uninstallation is the reverse of installation with a single movement of the sliding handle both unlatching and disconnecting the connections.

18 Claims, 7 Drawing Sheets

GUIDE TO INSTALLATION, OPERATION AND LATCHING OF POWER CABLES

BACKGROUND

To install power distribution board (PDB) cables into a chassis a user must typically fit their hand in a small, confined space. PDB cables are typically thick, e.g., 12 AWG cables that are pre-formed into shape. The shortness of length, length tolerances, and stiffness of the PDB cables sometimes makes the cables difficult to connect manually by the installers. In addition, when uninstalling the cable, it is difficult to squeeze the latches on the individual connectors to release them from the board-side PDB cable connectors. The difficulty in accessing the connectors to unlatch them may result in damage to the PDB cables, or PDB connectors, or PDB board caused by improper attempts to remove a PDB cable.

Thus, what is needed is an apparatus to facilitate the installation and removal of PDB cables.

BRIEF DESCRIPTION OF THE DRAWINGS

The embodiments are illustrated by way of example and not limitation in the accompanying drawings, in which like references indicate similar elements, and in which.

DETAILED DESCRIPTION

Embodiments described within disclose a guide that facilitates the installation and removal of cabling in hard-to-reach locations using a holder to maintain the relative locations of the PDB cable and cable-side connectors and a handle that slides with respect to the holder. The handle may be used to move the PDB cable and cable-side connectors into position with respect to board-side PDB connectors within a chassis. With further downward movement or insertion of the handle, the connectors are then mated. With the handle in a fully downward, inserted, or otherwise latched position with respect to the holder, raised sections of the handle prevent latching teeth or hooks on the PDB cable-side connector from becoming disengaged from the PDB board-side connector, thereby maintaining the connection of the PDB connectors. To disconnect the PDB cable, the handle may be moved to a raised, withdrawn, or otherwise unlatched position with respect to the holder, which causes the raised sections of the handle to move against and depress connector elements that cause the latch teeth to disengage from the PDB board-side connector. Further upward or disengaging motion of the handle causes the PDB cable-side connectors to disengage from the PDB board-side connectors. Thus, the PDB cable may be installed and removed without the user being required to manually manipulate either the PDB cable-side connector or the even smaller PDB cable-side connector latching teeth.

Figure 1:
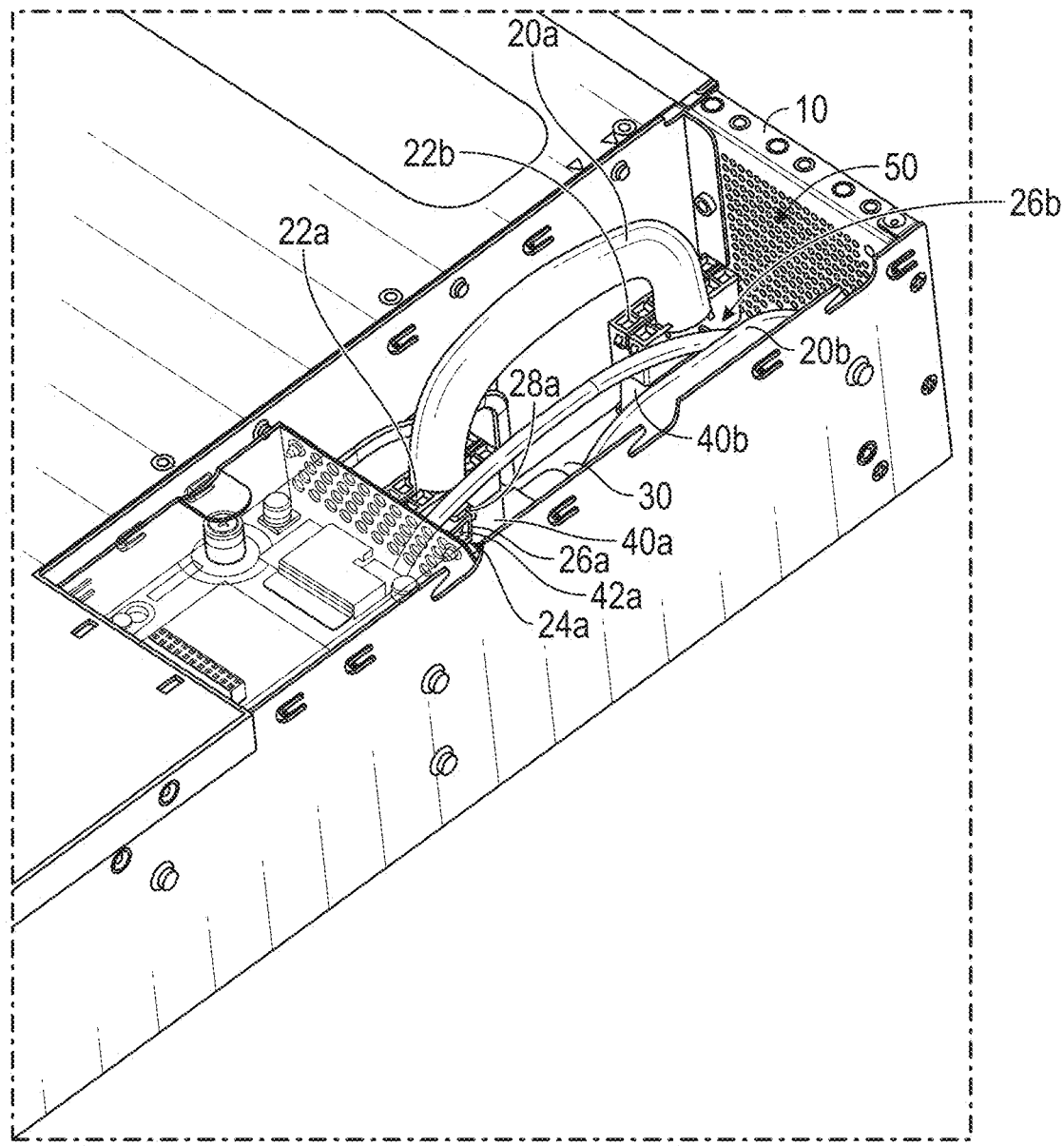
FIG. 1 is top right perspective view of an apparatus of the prior art.

FIG. 1 is top right perspective view of an apparatus of the prior art. In FIG. 1 a chassis 10 is provided with a PDB board 30 having PDB board-side connectors 40a, 40b. PDB cables 20a are connected between PDB cable-side connectors 22a, 22b. PDB cables 20b are connected the same as cables 20a and discussion with regard to cables 20a applies equally to cables 20b. For each pair of mated connectors, e.g., cable-side connector 22a and board-side connector 40a, a latch tooth 42a of PDB board-side connector 40a is retained within a slot 24a of connector latch 26a. To disconnect, a connector latch boss 28a is depressed, which causes latch 26a to pivot and raise slot 24a so that tooth 42a is no longer retained. At this point cable-side connector 22a may be disconnected from board-side connector 40a. This description with regard to connectors 22a, 40a applies equally to the connectors 22b. With access to the connectors limited to an upper opening 50, it is difficult for user to properly position cable-side connectors 22a, 22b for connection, and it is difficult for users to manipulate connector latches 26a, 26b (obscured but identical to 26a and in the same position as 26a but on connector 22b) and remove cables 20a.

Figure 2:
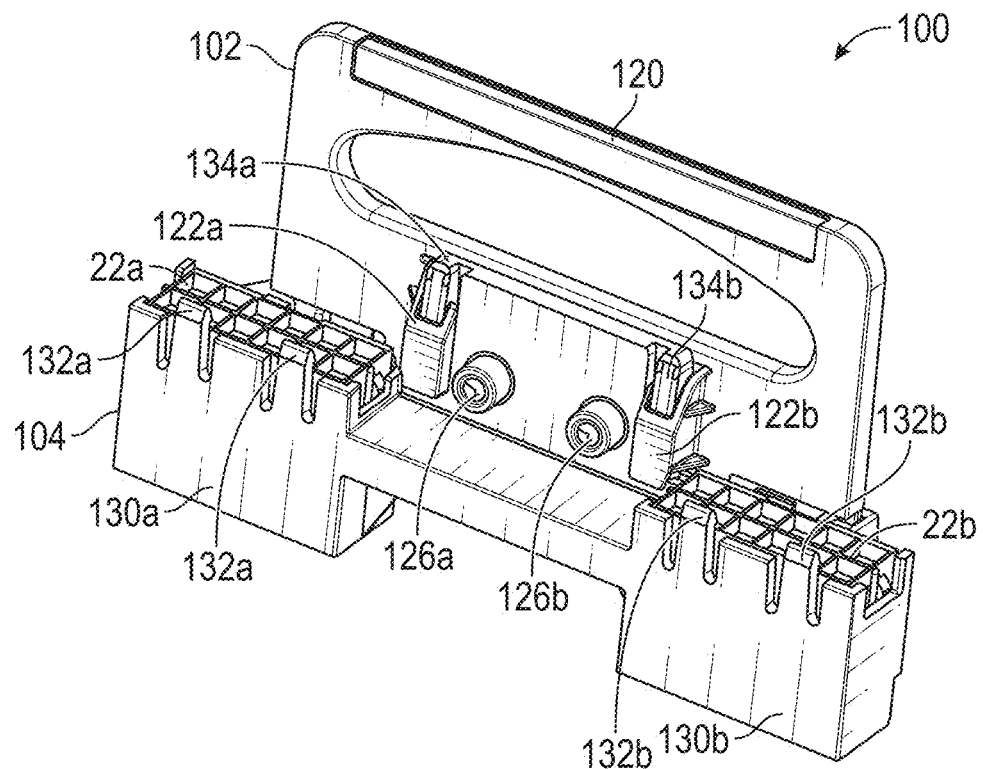
FIG. 2 is a top right perspective view of an embodiment of a cable latching guide.

FIG. 2 is a top right perspective view of an embodiment of a cable latching guide 100. In FIG. 2, cable latching guide 100 includes a sliding handle 102 and a holder 104. Cable latching guide 100, including sliding handle 102 and holder 104 is symmetrical about a vertical centerline between fasteners 126a, 126b and description of one side of sliding handle 102 or holder 104 applies equally to the other. Sliding handle 102 includes a handle section 120 and elongate rail guides 122a, 122b. Holder 104 includes connector pods 130a, 130b and rails 134a, 134b. Holder 104 thus fixes the relative positions of connectors 22a, 22b. Sliding handle 102 and holder 104 are joined by fasteners 126a, 126b (see also, e.g., FIG. 4). Sliding handle 102 slides with respect to holder 104 along rails 134a, 134b with elongate guides 122a, 122b preventing sliding handle 102 from twisting with respect to holder 104 in the process. Cable-side connectors 22a, 22b are received within connector pods 130a, 130b and retained within pods 130a, 130b by retaining teeth 132a, 132b. In other words, connectors 22a, 22b are inserted into pods 130a, 130b, snap into place and are held rigidly in the proper position by pods 130a, 130b and teeth 132a, 132b. Teeth 132a, 132b are flexible and allow the user to service or swap the cable, e.g., if damaged.

Figure 3:
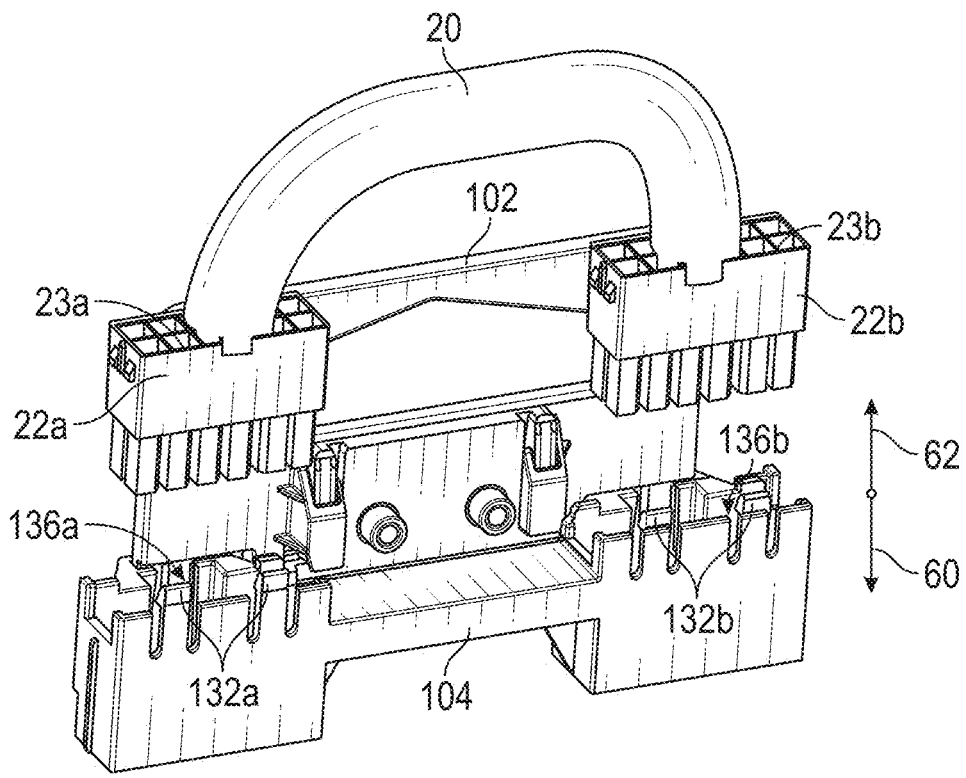
FIG. 3 is a top left perspective view of the embodiment of a cable latching guide of FIG. 2.

FIG. 3 is a top left perspective view of the embodiment of cable latching guide 100 of FIG. 2. In FIG. 3, PDB cables 20a and connectors 22a, 22b are shown to be installed within cable latching guide 100 by inserting connectors 22a, 22b in a direction 60 into connector bays 136a, 136b of connector pods 130a, 130b, respectively until upper edges 23a, 23b pass retaining teeth 132a, 132b. Thus installed, connectors 22a, 22b are maintained within pods 130a, 130b by retaining teeth 132a, 132b inhibiting relative upward movement in a direction 62 of edges 23a, 23b.

Figure 4:
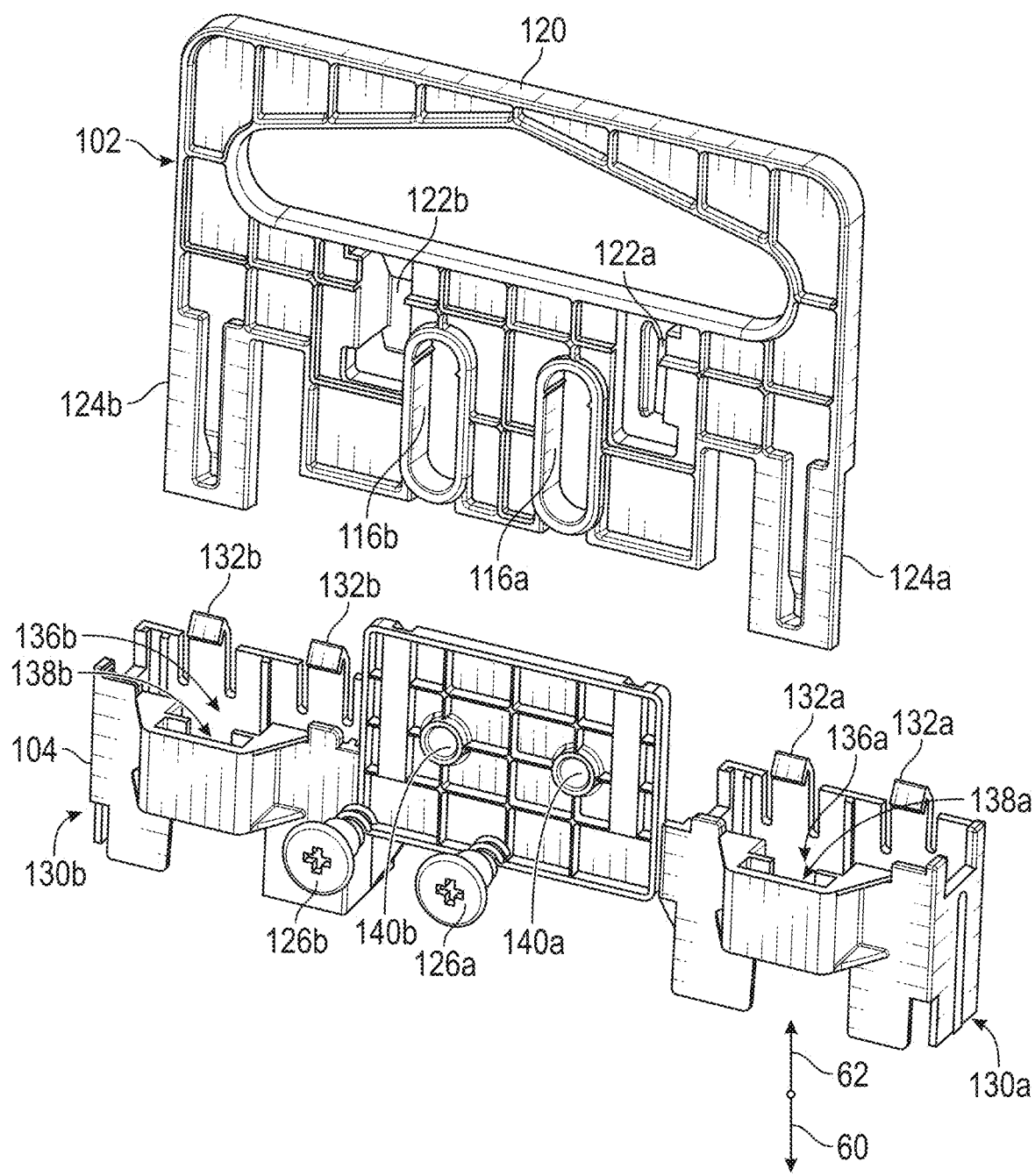
FIG. 4 is a rear top left perspective view of an exploded assembly of the embodiment of a cable latching guide of FIG. 2.

FIG. 4 is a rear top left perspective view of an assembly of the embodiment of cable latching guide 100 of FIG. 2. In FIG. 4, sliding handle 120 is shown to include elongate legs 124a, 124b and slots 116a, 116b. Holder 104 is shown to include leg slots 138a, 138b adjacent to connector bays 136a, 136b and threaded fastener holes 140a, 140b. To assemble, elongate legs 124a, 124b are fed into leg slots 138a, 138b until fastener holes 140a, 140b are visible through slots 116a, 116b. Then fasteners 126a, 126b are fed through slots 116a, 116b and screwed into holes 140a, 140b, which may be threaded or the screws may be self-threading.

Figure 5A:
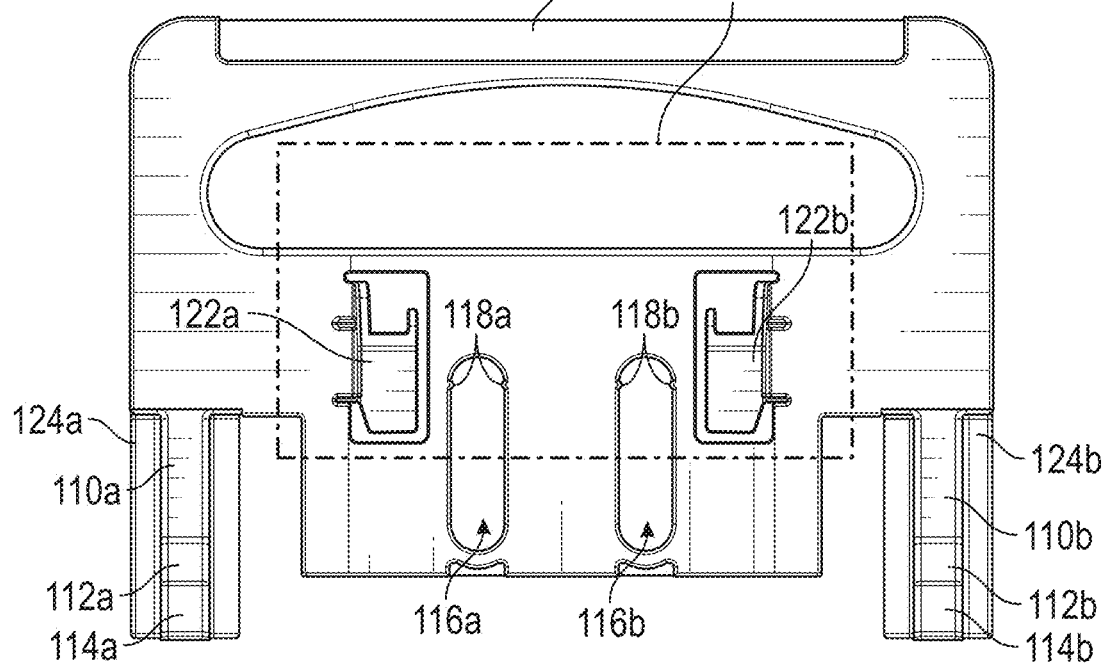
FIG. 5A is a front view of aspects of the embodiment of a cable latching guide of FIG. 2.
Figure 5B:
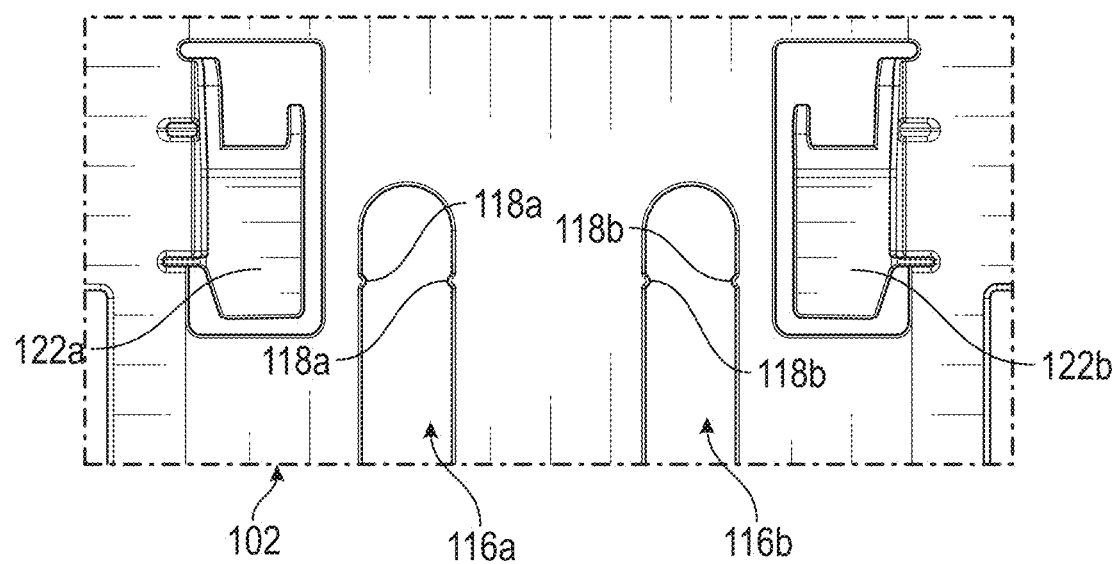
FIG. 5B is a detail view of the section indicated in FIG. 5A.

FIG. 5A is a front view of aspects of sliding handle 102 and FIG. 5B is a detail view of the section indicated in FIG. 5A. In FIG. 5A, each elongate leg 124a, 124b is shown to include a rib 110a, 110b that further includes a ramp 112a, 112b to a plateau or raised section 114a, 114b. Slots 118a, 118b are shown to include detents 118a, 118b. Detents 118a, 118b releasably hinder movement of fasteners 126a, 126b. When sliding handle 102 is moved to the latched, downward position with respect to holder 104, fasteners 126a, 126b are located at the upper end of slots 116a, 116b. Detents 118a, 118b hinder movement of fasteners 126a, 126b away from that upper end and, therefore, work to maintain sliding handle 102 in the latched, downward position. In other words, detents 118a, 118b work to prevent sliding handle 102 from moving as a result of shock or vibration.

Figure 6A:
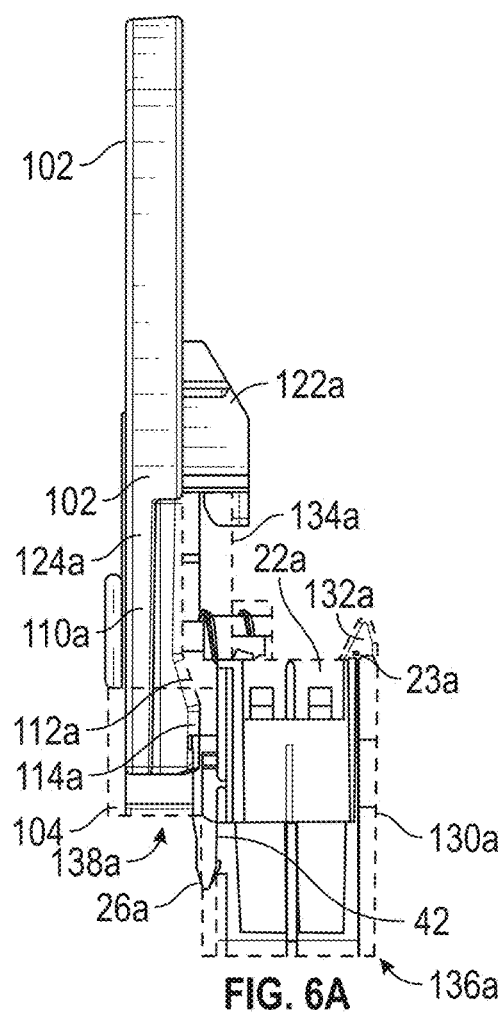
FIG. 6A is a partially-transparent left side view of the embodiment of a cable latching guide of FIG. 2.

FIG. 6A is a partially-transparent left side view of the embodiment of cable latching guide 100 of FIG. 2. In FIG. 6A, sliding handle 102 is in an unlatched, withdrawn position with respect to holder 104. Elongate leg 124a is shown received within leg slot 138a. Rib 110a is shown to include ramp 112a and plateau 114a. PDB cable-side connector 22a is received within connector bay 136a and retained within by teeth 132a against connector edge 23a.

Figure 6B:
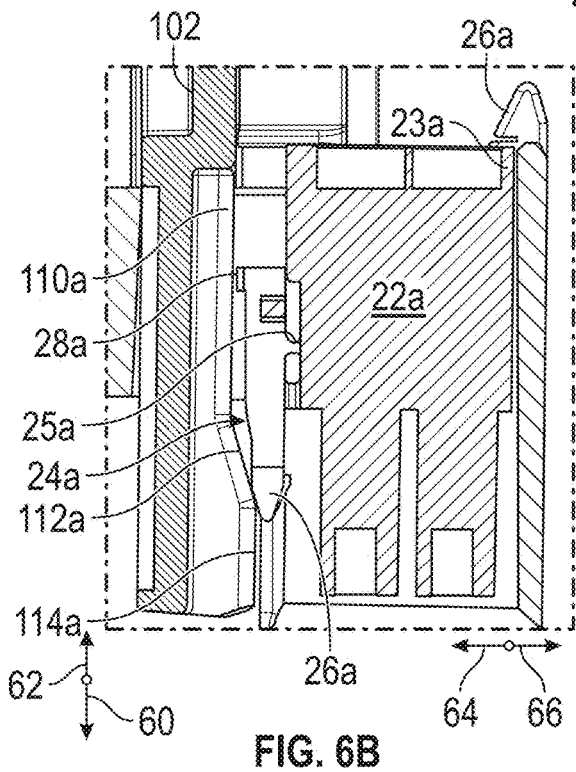
FIG. 6B is a detail view of the section indicated in FIG. 6A.
Figure 6C:
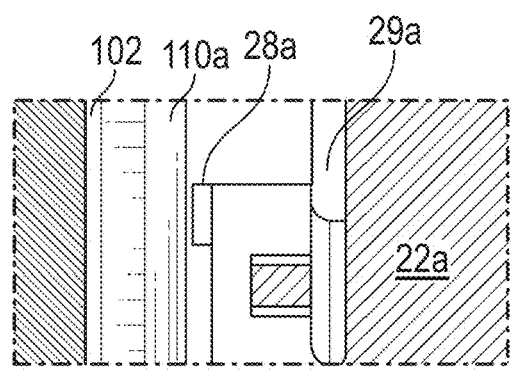
FIG. 6C is a detail view of the section indicated in FIG. 6B.

FIG. 6B is a detail view of the section indicated in FIG. 6A, however with sliding handle 102 in the latched, inserted position. FIG. 6C is a detail view of the section indicated in FIG. 6B. In FIG. 6B, with sliding handle 102 in the latched, inserted position, raised section 114a prevents an end of latch 26a from moving in a direction 64. This prevents latch 26a from releasing a latch tooth 42 (not shown in FIG. 6B). Thus, when in the latched position, sliding handle 102 assists in maintaining the connections between cable-side connectors 22a, 22b and board side connectors 40a, 40b. From the position shown in FIG. 6A, when sliding handle 102 is raised in direction 62 with respect to holder 104, raised section 114a moves along connector latch 26a. Eventually, ramp 112a and raised section 114a run over a connector latch boss 28a, forcing it inward in direction 66. This causes connector latch 26a to pivot about a latch pivot 25a such that latch slot 24a is moved outwardly in direction 64, which would release a latch tooth 42. Thus, ramps 112a, 112b convert the vertical motion of sliding handle 102 to a horizontal motion which actuates connector latches 26a, 26b. Furthermore, there is no stress on the connector latch when the sliding handle is in the inserted, latched position. FIG. 6C further illustrates connector latch boss 28a. A connector boss 29a does not hinder movement of latch boss 28a in direction 66 as boss 29a is not in the path of movement of boss 28a.

FIG. 7A through FIG. 7D are rear upper left perspective views illustrating the use of the embodiment of a cable latching guide of FIG. 2.

Figure 7A:
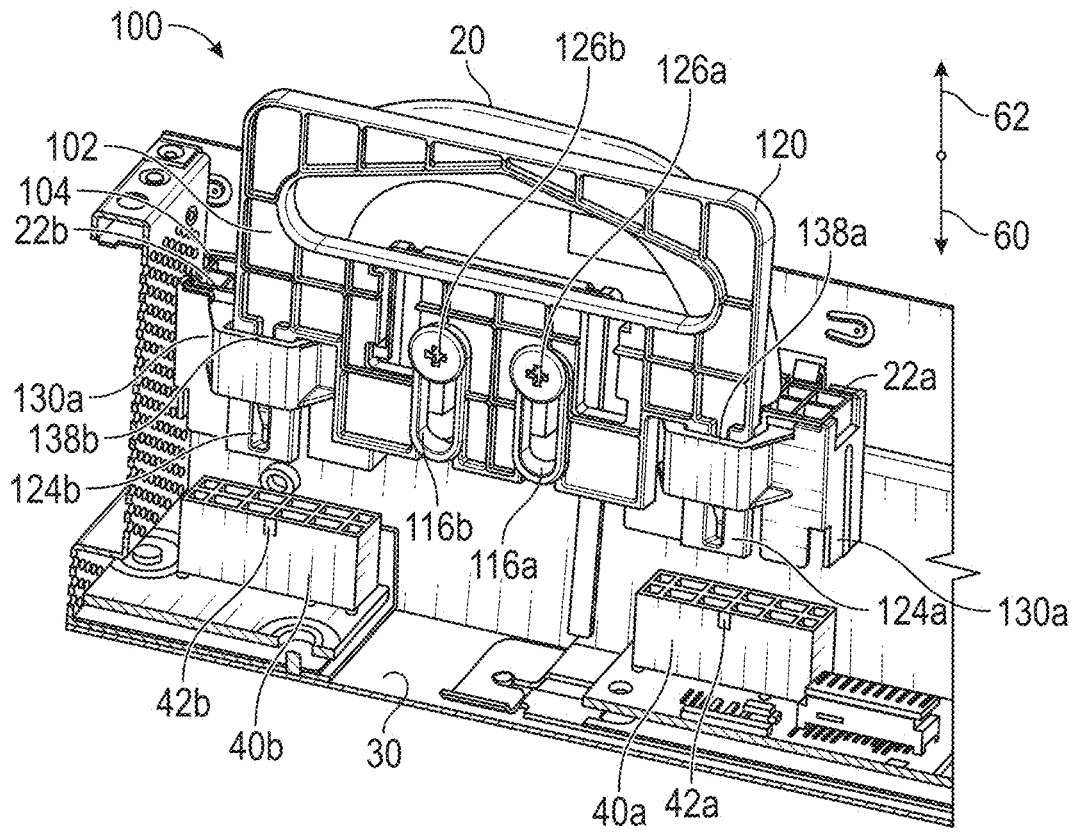
FIG. 7A through FIG. 7D are rear upper left perspective views illustrating the use of the embodiment of a cable latching guide of FIG. 2.

In FIG. 7A, PDB cable 20 has been installed in guide 100 as discussed with respect to FIG. 3. Sliding handle 102 is in the inserted, latched position with respect to holder 104. A feature of guide 100 is that it may be connected and latched, i.e., installed, with handle 102 initially in the down position, as shown in FIG. 7A, so it only requires moving the handle to unlatch/remove.

Figure 7B:
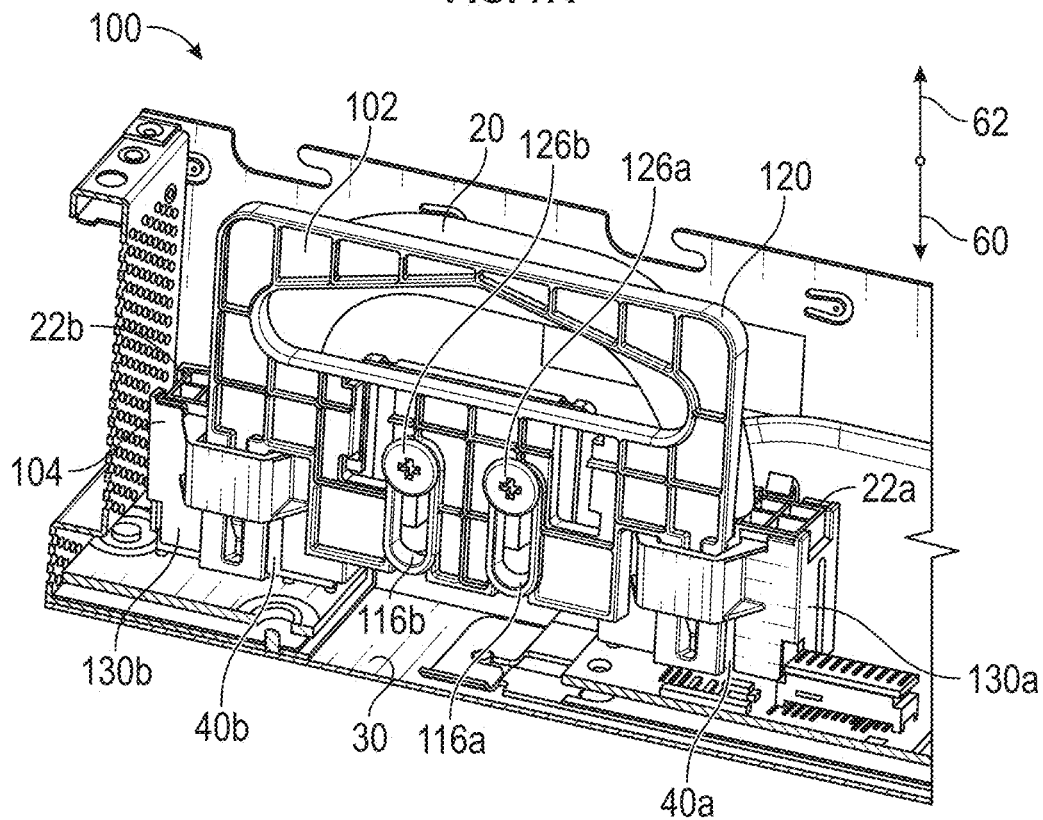

FIG. 7B illustrates guide 100 having been used to connect PDB cable-side connectors 22a, 22b to board-side connectors 40a, 40b. To make this connection, a user grasps handle section 120, positions cable-side connectors 22a, 22b in line with board-side connectors 40a, 40b and then, using handle section 120, mates the connections. This action causes latch teeth 42a, 42b to be received within latch slots 24a, 24b (not shown). With sliding handle 102 in the latched position shown in FIG. 7B, raised sections 114a, 114b hinder latch slots 24a, 24b from releasing latch teeth 42a, 42b. The latched position is indicated by the position of fasteners 126a, 126b at the upper extreme of slots 116a, 116b.

Figure 7C:
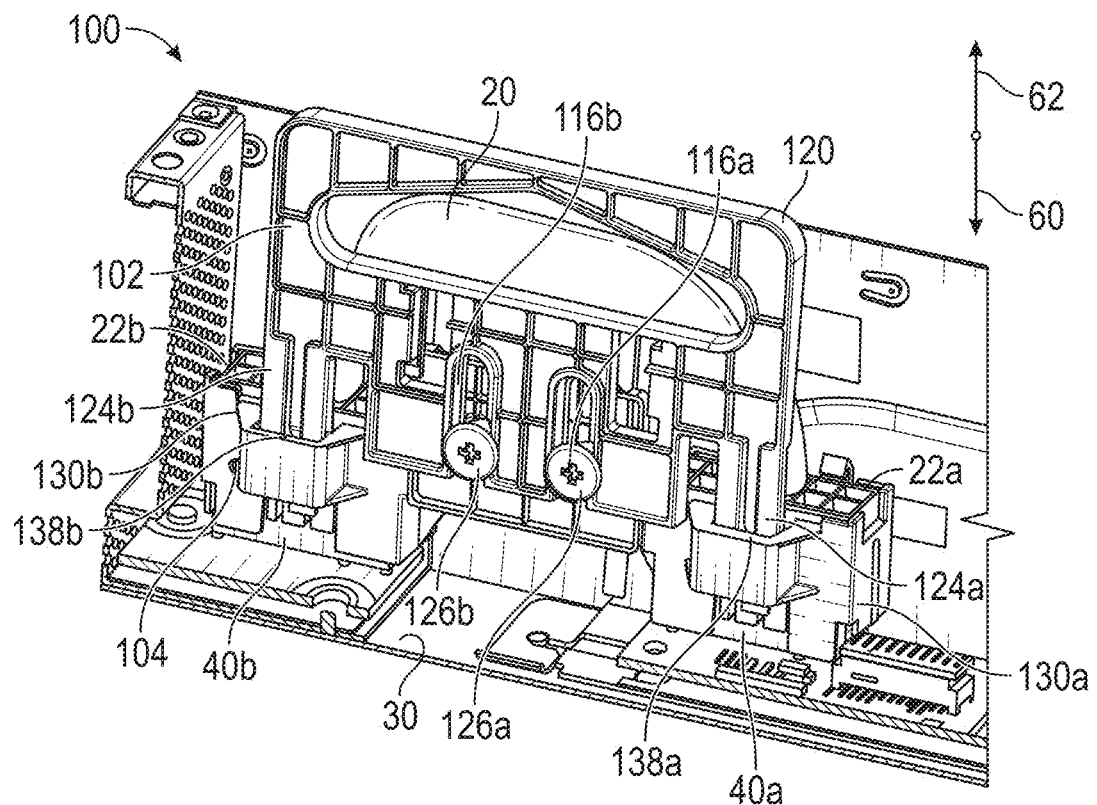

FIG. 7C illustrates a first step in the disconnection of PDB cable 20, which is the movement of sliding handle 102 to the withdrawn, unlatched position with respect to holder 104. The unlatched position is indicated by the position of fasteners 126a, 126b at the lower extreme of slots 116a, 116b. With sliding handle 102 in the unlatched position and as discussed with regard to FIG. 6B, raised sections 114a, 114b have moved from slots 24a, 24b (FIG. 1, FIG. 6A) and along latches 26a, 26b and have depressed latch bosses 28a, 28b (not shown), which caused latches 26a, 26b to pivot so that slots 24a, 24b move away from and no longer retain latch teeth 42a, 42b. Thus, FIG. 7C shows guide 100 in the unlatched position in which PDB cable-side connectors 22a, 22b may be disconnected from board-side connectors 40a, 40b.

Figure 7D:
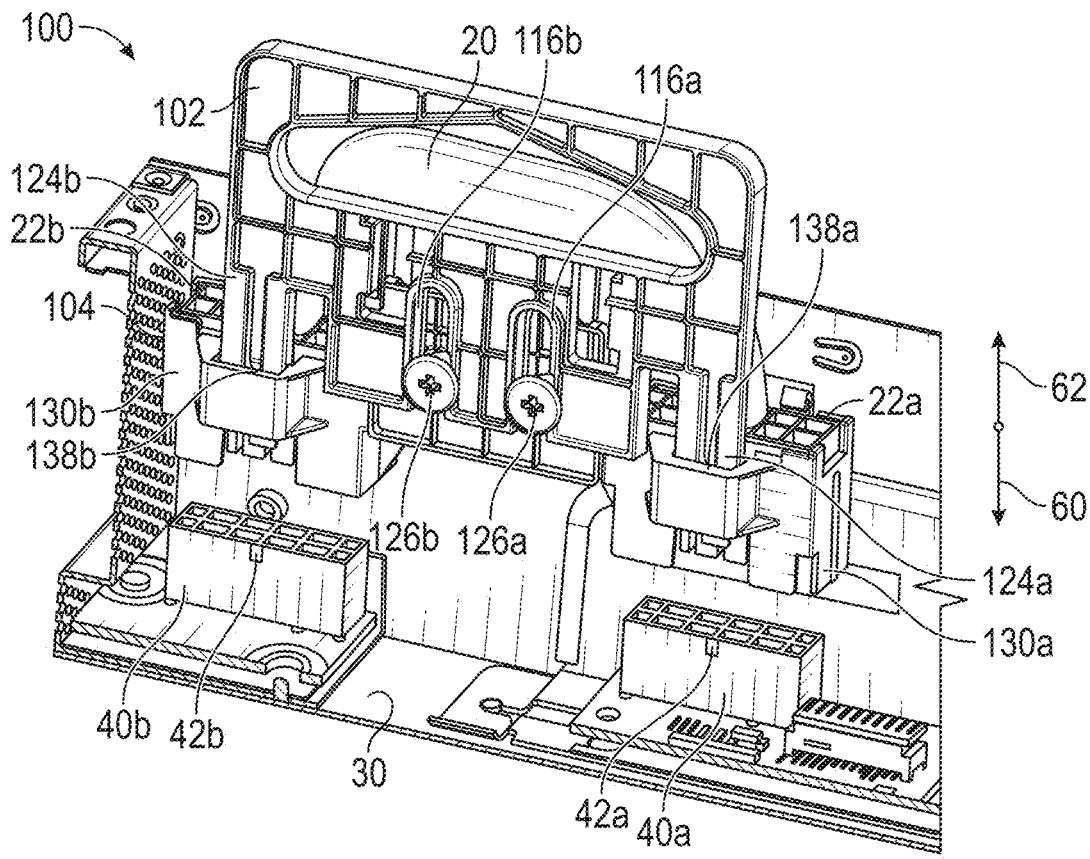

FIG. 7D illustrates cable latching guide 100 having been used to disconnect PDB cable-side connectors 22a, 22b from board-side connectors 40a, 40. To disconnect, a user grasps sliding handle 102 and tugs until cable-side connectors 22a, 22b disconnect from board-side connectors 40a, 40b. The disconnection is not hindered by connector latches 26a, 26b. In sum, as seen in FIG. 7C and FIG. 7D, a single, continuous upward movement of sliding handle 102 will both release cable-side connector latches 26a, 26b, and disconnect connectors 22a, 22b from board-side connectors 40a, 40b.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus including:
a holder configured to retain a first connector and a second connector oriented such that the first connector and second connector are connectable to a third connector and fourth connector, respectively, with movement of the holder in a first direction;
a handle slidably connected to the holder and slidable between a latched position and an unlatched position, the handle including a first raised section and a second raised section, wherein:
the first raised section and the second raised section are provided on the handle such that the first raised section hinders a disengaging motion of a first connector latch of the first connector and the second raised section hinders a disengaging motion of a second connector latch of the second connector when the first connector and the second connector are retained by the holder and the handle is in the latched position.

2. The apparatus of claim 1, wherein the holder includes a first pod and a second pod, the first pod is configured to retain the first connector and the second pod is configured to retain the second connector.

3. The apparatus of claim 2, wherein:
the first pod being configured to retain the first connector includes the first pod having a first socket configured to receive the first connector and a first tooth configured to retain the first connector within the first socket; and
the second pod being configured to retain the second connector includes the second pod having a second socket configured to receive the second connector and a second tooth configured to retain the second connector within the second socket.

4. The apparatus of claim 1, wherein the first raised section and the second raised section are provided on the handle such that the first raised section causes the disengaging motion of the first connector latch of the first connector and the second raised section causes the disengaging motion of the second connector latch of the second connector when the first connector and the second connector are retained by the holder and the handle moves to the unlatched position.

5. The apparatus of claim 4, wherein the handle includes a first leg upon which the first raised section is provided and a second leg upon which the second raised section is provided.

6. The apparatus of claim 5, wherein the first leg includes a first rib extending to first raised section and the second leg includes a first rib extending to second raised section.

7. The apparatus of claim 6, wherein:
the first leg includes a first ramp provided on the first rib and providing a transition from the first rib to the first raised section; and
the second leg includes a second ramp provided on the second rib and providing a transition from the second rib to the second raised section.

8. The apparatus of claim 1, further comprising the handle being provided with a first slot and the holder being connected to the handle by a fastener that slides within the first slot, wherein the first slot includes a detent configured to releasably maintain the fastener within the first slot at a position corresponding to the handle being in the latched position.

9. The apparatus of claim 8, wherein:
the holder includes a first pod and a second pod;
the first pod is configured to retain the first connector and includes a first leg slot;
the second pod is configured to retain the second connector and includes a second leg slot;
the handle includes a first leg upon which the first raised section is provide and a second leg upon which the second raised section is provided;
the first leg includes a first rib extending to first raised section;
the second leg includes a first rib extending to second raised section; and
the first leg slot is configured to slidably receive the first leg, first rib, and first raised section, and the second leg slot is configured to slidably receive the second leg, second rib, and second raised section.

10. An apparatus including:
a holder retaining a first connector and a second connector oriented such that the first connector and second connector are connectable to a third connector and fourth connector, respectively, with movement of the holder in a first direction;
a handle slidably connected to the holder and slidable between a latched position and an unlatched position, the handle including a first raised section and a second raised section; and
wiring electrically connecting the first connector to the second connector, wherein:
the first raised section and the second raised section are provided on the handle such that the first raised section hinders a disengaging motion of a first connector latch of the first connector and the second raised section hinders a disengaging motion of a second connector latch of the second connector when the first connector and the second connector are retained by the holder and the handle is in the latched position.

11. The apparatus of claim 10, wherein the holder includes a first pod and a second pod, the first pod being configured to retain the first connector and the second pod being configured to retain the second connector.

12. The apparatus of claim 11, wherein
the first pod being configured to retain the first connector includes the first pod having a first socket configured to receive the first connector and a first tooth configured to retain the first connector within the first socket; and
the second pod being configured to retain the second connector includes the second pod having a second socket configured to receive the second connector and a second tooth configured to retain the second connector within the second socket.

13. The apparatus of claim 10, wherein the first raised section and the second raised section are provided on the handle such that the first raised section causes the disengaging motion of the first connector latch of the first connector and the second raised section causes the disengaging motion of the second connector latch of the second connector when the first connector and the second connector are retained by the holder and the handle moves to the unlatched position.

14. The apparatus of claim 13, wherein the handle includes a first leg upon which the first raised section is provided and a second leg upon which the second raised section is provided.

15. The apparatus of claim 14, wherein the first leg includes a first rib extending to first raised section and the second leg includes a first rib extending to second raised section.

16. The apparatus of claim 15, wherein the first leg includes a first ramp provided on the first rib and providing a transition from the first rib to the first raised section and the second leg includes a second ramp provided on the second rib and providing a transition from the second rib to the second raised section.

17. The apparatus of claim 10, further comprising the handle being provided with a first slot and the holder being connected to the handle by a fastener that slides within the first slot, wherein the first slot includes a detent configured to releasably maintain the fastener within the first slot at a position corresponding to the handle being in the latched position.

18. The apparatus of claim 17, wherein the handle being slidably connected to the holder further includes:

the holder includes a first pod and a second pod;

the first pod is configured to retain the first connector and includes a first leg slot;

the second pod is configured to retain the second connector and includes a second leg slot;

the handle includes a first leg upon which the first raised section is provided and a second leg upon which the second raised section is provided;

the first leg includes a first rib extending to first raised section;

the second leg includes a first rib extending to second raised section; and the first leg slot is configured to slidably receive the first leg, first rib, and first raised section, and the second leg slot is configured to slidably receive the second leg, second rib, and second raised section.

* * * * *